(12) United States Patent
Roy

(10) Patent No.: US 9,543,015 B1
(45) Date of Patent: Jan. 10, 2017

(54) MEMORY ARRAY AND COUPLED TCAM ARCHITECTURE FOR IMPROVED ACCESS TIME DURING SEARCH OPERATION

(71) Applicant: FREESCALE SEMICONDUCTOR, INC., Austin, TX (US)

(72) Inventor: Anirban Roy, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/860,945

(22) Filed: Sep. 22, 2015

(51) Int. Cl.
*G11C 15/00* (2006.01)
*G11C 7/00* (2006.01)
*G11C 15/04* (2006.01)

(52) U.S. Cl.
CPC .................. *G11C 15/046* (2013.01)

(58) Field of Classification Search
None
See application file for complete search history.

(56) References Cited

U.S. PATENT DOCUMENTS

| | | | |
|---|---|---|---|
| 8,089,961 B2 | 1/2012 | Sahni et al. | |
| 2003/0179623 A1* | 9/2003 | Inoue | G11C 15/043 365/200 |
| 2006/0092725 A1* | 5/2006 | Min | G11C 29/787 365/200 |
| 2008/0298110 A1* | 12/2008 | Wickeraad | G11C 15/00 365/49.17 |
| 2014/0112045 A1* | 4/2014 | Arsovski | G11C 15/00 365/49.17 |

OTHER PUBLICATIONS

Eshraghian et al, "Memristor MOS Content Addressable Memory (MCAM): Hybrid Architecture for Future High Performance Search Engines", IEEE Transactions on Very Large Scale Integration (VLSI) Systems, Aug. 2011, pp. 1407-1417, vol. 19, No. 8.
Jinn-Shyan et al, "High-Speed and Low-Power CMOS Priority Encoders", IEEE Journal of Solid-State Circuits, Oct. 2000, pp. 1511-1514, vol. 35, No. 10.
Guo et al, "A Resistive TCAM Accelerator for Data-Intensive Computing", Micro '11, Dec. 3-7, 2011, pp. 1-12.
Renesas, "20Mbit QUAD-Search Content Addressable Memory", 2010, pp. 1-2.
Pagiamtzis et al, "Content-Addressable Memory (CAM) Circuits and Architectures: A Tutorial and Survey", IEEE Journal of Solid-State Circuits, Mar. 2006, pp. 712-727, vol. 41, No. 3.
Huang et al, "ReRAM-based 4T2R Nonvolatile TCAM with 7x NVM-Stress Reduction, and 4x Improvement in Speed-WordLength-Capacity for Normally-Off Instant-On Filter-Based Search Engines Used in Big-Data Processing", IEEE Symposium on VLSI Circuits Digest of Technical Papers, 2014, pp. 978-979.
Gupta et al, "Algorithms for Packet Classification", IEEE Network, Mar./Apr. 2001, pp. 24-32, vol. 15, No. 2.

\* cited by examiner

*Primary Examiner* — Son Dinh
*Assistant Examiner* — Sultana Begum

(57) ABSTRACT

A memory device includes a first ternary content addressable memory (TCAM), a second TCAM, a memory array coupled to the first and second TCAMs, a first priority logic coupled between the first TCAM and the memory array, a second priority logic coupled between the second TCAM and the memory array, and a look-ahead signal generated by the first priority logic and provided to the second priority logic. Match lines from the first and second TCAMs are coupled to respective word lines in the memory array.

20 Claims, 6 Drawing Sheets

NV TCAM

TCAM

MEMORY ARRAY AND COUPLED TCAM ARCHITECTURE FOR IMPROVED ACCESS TIME DURING SEARCH OPERATION

BACKGROUND

Field

This disclosure relates generally to memories, and more specifically, to a memory array coupled with one or more ternary content addressable memories (TCAM).

Related Art

A content addressable memory (CAM) is a type of memory that is typically used in high-speed search operations. For a search operation, a CAM compares input search data against a table including rows of stored data, and returns the address of the matching data. Two basic types of CAMs include a binary CAM (BCAM) and a ternary CAM (TCAM). In a BCAM, each bitcell stores one of two data states, a logic "1" or a logic "0", such that the input search data is compared with each row of the BCAM to determine whether the stored data of the row matches the input search data. In a TCAM, each bitcell stores one of three data states, a logic "1", a logic "0", or a "don't care" value, in that the "don't care" value results in a match of the bit regardless of the value of the input bit of the search data. In order to encode three data states, each TCAM bitcell is configured to store two bits.

The address returned during a search operation can be used to retrieve data from a random access memory (RAM), which is a type of memory that is often implemented as volatile memory. One type of RAM is static RAM (SRAM), which uses latching circuitry to store data. A traditional SRAM includes a plurality of bitcells, where each bitcell stores a bit of data. In a traditional SRAM, the bitcells statically store data, as opposed to a dynamic RAM (DRAM), where the data stored at each bitcell needs to be periodically refreshed. However, a traditional SRAM is still considered volatile memory because the data stored by the SRAM is lost when power to the SRAM is lost.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted.

Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.

Overview

Conventionally, a ternary content addressable memory (TCAM) can be utilized to search for an address that is used to retrieve data from a memory, such as random access memory (RAM). For example, a TCAM receives search data on a plurality of search lines. If a match for the search data is found, the TCAM activates a match line, which is received by a priority encoder. The priority encoder then generates an appropriate address for the match line, which is provided to the RAM in order to retrieve the data of the address. However, translating the activated match line to an address that needs to be decoded by the RAM in order to access the data stored at the address in the RAM takes some time, making it desirable to reduce such access time. Further, as technology continues to drive semiconductor devices to become smaller, it is desirable to scale down the size of the TCAM and the RAM.

The present disclosure provides for a memory device that implements compact memory architecture by tightly coupling a TCAM and a memory array. The TCAM and the memory array may each store data in a volatile or non-volatile manner. Due to the nature of the circuitry involved in the TCAM and the memory array, the TCAM is twice as large as the memory array. In some embodiments, the TCAM is divided into two portions, TCAM1 and TCAM2, on either side of the memory array, which provides a more compact footprint occupied by the TCAM and the memory array. The match line pitch of each of the two TCAMs is matched (or corresponds) to the word line pitch of the memory array. Priority logic is configured to drive a word line of the memory array directly when a corresponding match line is activated. Since translation of the match line into an address is not needed, access time during a search operation is greatly improved.

The size of each of the TCAM portions and the memory array can be further reduced by implementing non-volatile memory cells in the TCAM, in the memory array, or in both. A non-volatile memory cell includes one or more programmable resistive elements, which is made of a dielectric solid-state material whose resistance can be changed using an appropriate voltage. Each programmable resistive element implements at least two levels of resistance (also referred to as resistive states): a high resistive state (HRS) and a low resistive state (LRS). The resistive states are used to represent a data value, or bit, stored by the memory cell in a non-volatile manner. Non-volatile memory cells are generally smaller and simpler to implement than their volatile counterparts.

Example Embodiments

Figure 1:
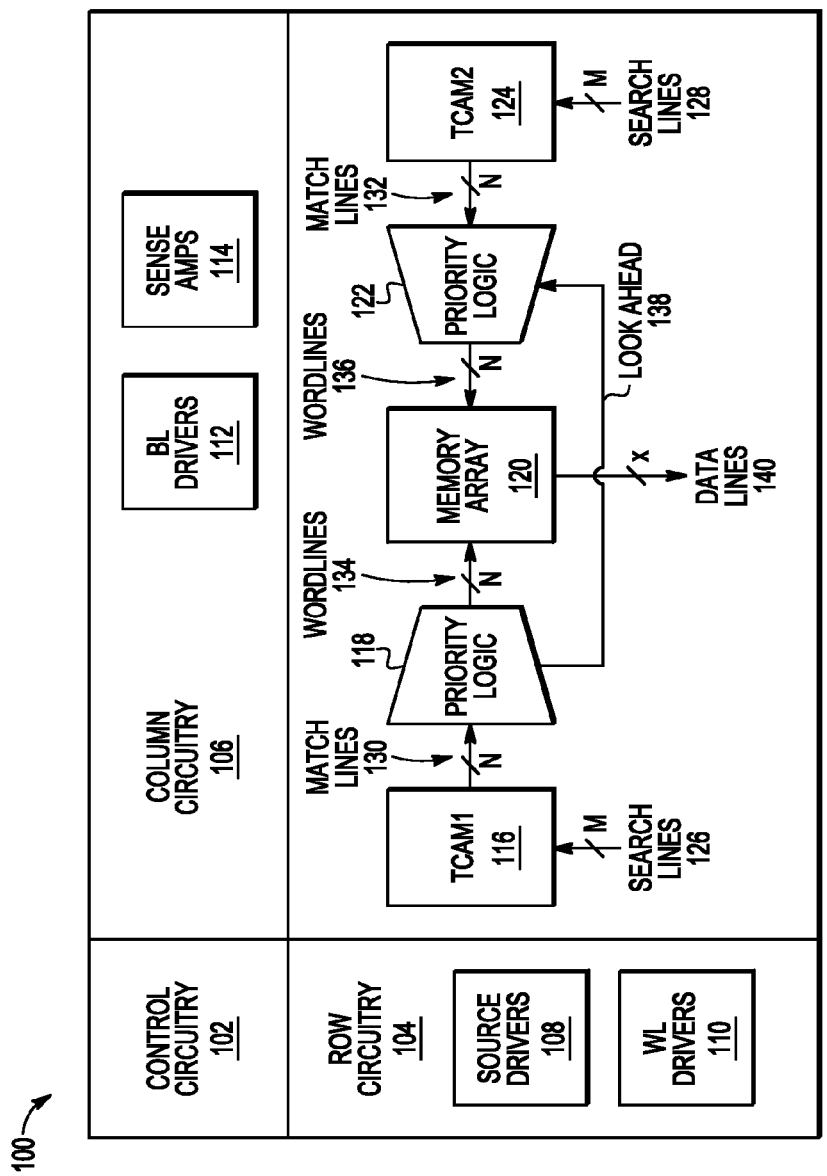
FIG. 1 illustrates a block diagram depicting an example memory device that includes a memory array and one or more ternary content addressable memories (TCAMs) associated with the memory array in which the disclosure is implemented, according to some embodiments.

FIG. 1 illustrates a block diagram depicting an example memory device 100 in which the disclosure is implemented. In some embodiments, memory device 100 is implemented on a die or semiconductor substrate as part of a processing system. Memory device 100 includes control circuitry 102, row circuitry 104, column circuitry 106, a memory array 120, a first ternary content addressable memory (TCAM1)

116, a second ternary content addressable memory (TCAM2) 124, first priority logic 118, and second priority logic 122.

Control circuitry 102 is coupled to row circuitry 104 and to column circuitry 106. Row circuitry 104 and column circuitry 106 are each coupled to memory array 120, to TCAM1 116, and to TCAM2 124. Control circuitry 102 is also coupled to priority logic 118 and 122, and to a central decoder of memory array 120, as further discussed below. Control circuitry 102 is configured to control column circuitry 106 and row circuitry 104 to implement memory operations (e.g., read, write, and search operations) on memory array 120, TCAM1 116, and TCAM2 124, such as by providing control signals and addresses to column circuitry 106 and row circuitry 104. Various data can be written to and read from each of TCAM1 116, TCAM2 124, and memory array 120. Column circuitry 106 includes bit line (BL) drivers 112 for activating bit lines of memory array 120, TCAM1 116, and TCAM2 124 during memory operations. Column circuitry 106 also includes sense amplifiers 114 for reading data values from data lines 140 of memory array 120 during memory operations. Sense amplifiers 114 are also configured to provide data from memory array 120 to a requesting processor, such as in response to a read request. Row circuitry 104 includes word line (WL) drivers 110 for activating word lines of memory array 120, TCAM1 116, and TCAM2 124 during memory operations. Row circuitry 104 also includes source line drivers 108 for providing one or more source or supply voltages to nodes in the memory cells of memory array 120, TCAM1 116, and TCAM2 124 during memory operations.

Figure 7:
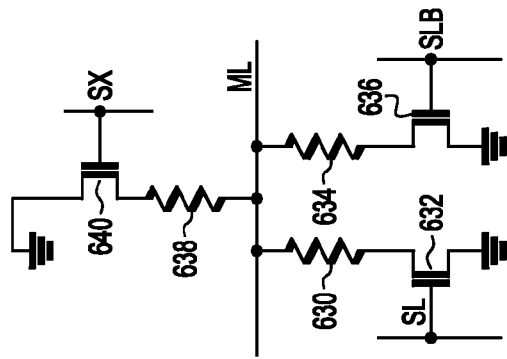
FIGS. 6 and 7 illustrate block diagrams of example memory cell structures utilized in an associated TCAM of the present disclosure, according to one embodiment.
Figure 6:
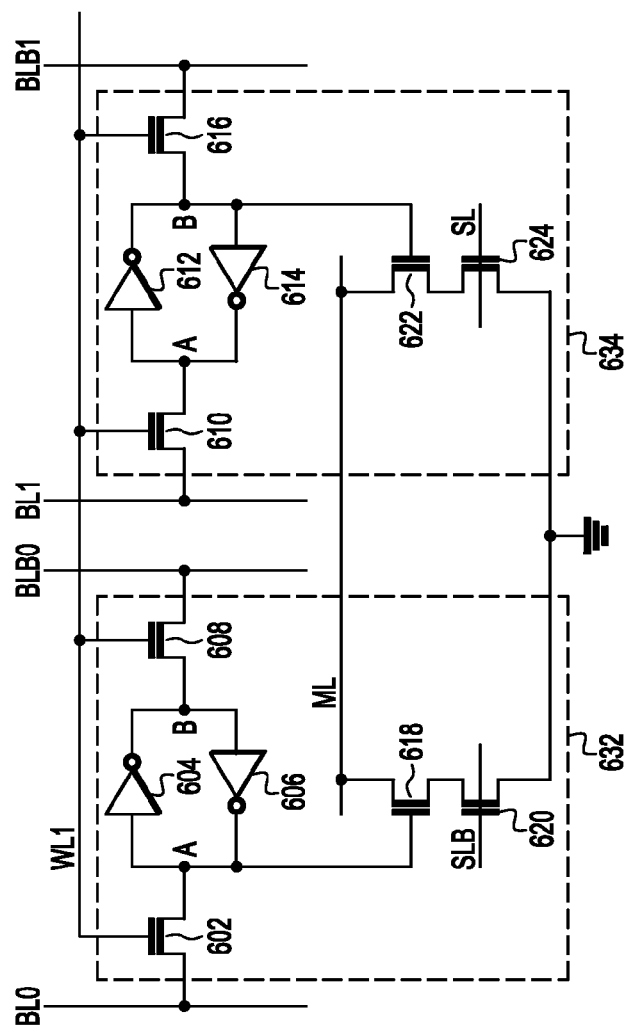

TCAM1 116 and TCAM2 124 each include a memory array having a plurality of TCAM memory cells that are arranged in an N number of rows and an M number of columns, with N and M being integers of one or more. In some embodiments, TCAM1 116 and TCAM2 124 are volatile memories, where TCAM memory cells store data in a volatile manner. In other embodiments, TCAM1 116 and TCAM2 124 are non-volatile memories, where TCAM memory cells store data in a non-volatile manner. An example volatile TCAM memory cell is illustrated in FIG. 6. An example non-volatile TCAM memory cell is illustrated in FIG. 7.

TCAM1 116 and TCAM2 124 each include an N number of word lines (WL) that each correspond to a row of memory cells in the respective TCAM, and an M number of paired bit lines, where each pair includes a true bit line (BL) and a complementary bit line (BLB), and where each pair of bit lines correspond to a column of memory cells in the respective TCAM. Each TCAM is configured to output an N number of match lines (such as match lines 130 and 132), where each match line (ML) corresponds to a row of memory cells in the respective TCAM. In some embodiments (e.g., volatile memory embodiments), each TCAM is configured to receive an M number of search lines (such as search lines 126 and 128) as input, where each search line (SL) corresponds to a column of memory cells in the respective TCAM. In other embodiments (e.g., non-volatile memory embodiments), each TCAM is configured to receive an M number of paired search lines, where each pair includes a true search line (SL) and a complementary search line (SLB) that correspond to a column of memory cells in the respective TCAM.

Figure 5:
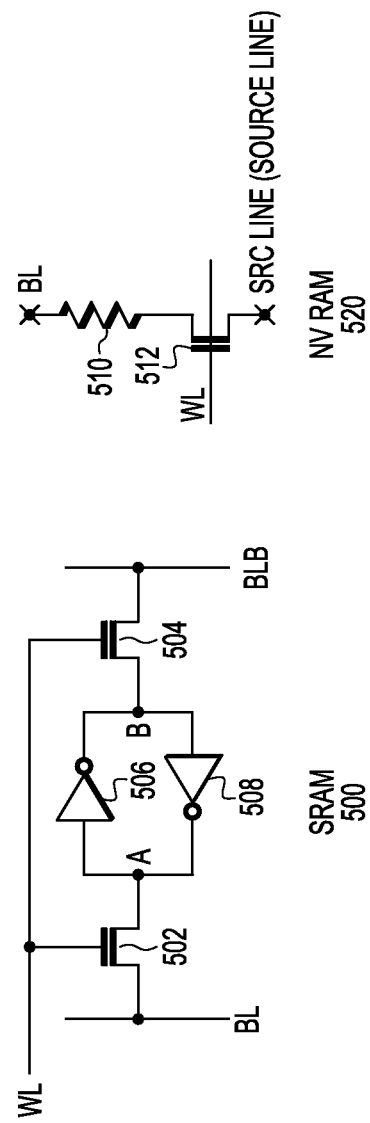
FIG. 5 illustrates block diagrams of example memory cell structures utilized in a memory array of the present disclosure, according to some embodiments.

Memory array 120 includes a plurality of memory cells that are arranged in a Y number of rows and an X number of columns, with X and Y being integers of one or more. In some embodiments, memory array 120 is a volatile memory, such as static RAM (SRAM), which includes memory cells that store data in a volatile manner. In other embodiments, memory array 120 is a non-volatile memory, such as a non-volatile RAM (NV RAM), which includes memory cells that store data in a non-volatile manner. Example volatile and non-volatile memory cells of memory array 120 are illustrated in FIG. 5.

Memory array 120 also includes a Y number of word lines, where each word line (WL) corresponds to a row of memory cells in memory array 120. In some embodiments (e.g., volatile memory embodiments), memory array 120 includes an X number of paired bit lines, where each pair includes a true bit line (BL) and a complementary bit line (BLB), and where each pair corresponds to a column of memory cells in memory array 120. In other embodiments (e.g., non-volatile memory embodiments), memory array 120 includes an X number of true bit lines (BL), where each bit line corresponds to a column of memory cells in memory array 120. In some embodiments (e.g., non-volatile memory embodiments), memory array 120 also includes an X number of source lines, where each source line corresponds to a column of memory cells in memory array 120. Memory array 120 is also configured to output an X number of data lines 140.

Priority logic 118 and 122 are respectively coupled between each TCAM 116, 124 and memory array 120. Priority logic 118 is configured to receive match lines 130 of TCAM1 116 as input, and to output a set of N word lines 134, which are coupled to memory array 120. Priority logic 122 is configured to receive match lines 132 of TCAM2 124 as input, and to output another set of N word lines 136, which are also coupled to memory array 120. In the embodiment shown, memory array 120 has Y word lines, where Y equals 2N (where the Y word lines of memory array 120 are evenly divided between TCAM1 116 and TCAM2 124). In other words, the sum of the total number of rows in both TCAM1 116 and TCAM2 124 equal the number of rows in memory array 120.

During a search operation, TCAM1 116 and TCAM2 124 receive input search data respectively on search lines 126 and 128. Each memory cell in TCAM1 116 and TCAM2 124 is configured to compare the search data on a respective search line with data stored in the memory cell. If data stored in a row of TCAM1 116 memory cells matches the input search data, a match line that corresponds to the row is activated and is received by priority logic 118. Similarly, if data stored in a row of TCAM2 124 memory cells matches the input search data, a match line that corresponds to the row is activated and is received by priority logic 122. In response to receiving an activated match line from TCAM1 116, priority logic 118 is configured to activate one of word lines 134 that corresponds to the activated match line. Priority logic 118 is designated as having higher priority over priority logic 122, where priority logic 122 is initially disabled during a search operation. While disabled, priority logic 122 does not output any activated word lines, even if an activated match line is received from TCAM2 124.

If priority logic 118 does not receive any activated match lines from TCAM1 116 (indicating no matches were found in TCAM1 116), priority logic 118 outputs a look ahead signal 138 to priority logic 122 to enable priority logic 122 (and to search for matches in TCAM2 124). Once enabled, priority logic 122 is configured to activate one of word lines 136 that corresponds to an activated match line received from TCAM2 124. If priority logic 118 receives multiple activated match lines from TCAM1 116, priority logic 118 is configured to select one of the activated match lines, based on predefined priority of the match lines 130. Similarly, if priority logic 122 receives multiple activated match lines from TCAM2 124 and priority logic 122 is enabled, priority logic 122 is configured to select one of the activated match lines, based on predefined priority of the match lines 132. In this manner, one word line of memory array 120 is activated by either priority logic 118 or 122 during a search operation. In response to the (single) activated word line, memory array 120 is configured to output the data corresponding to the activated word line on data lines 140. Priority logic is further discussed below in connection with FIG. 2. The relationships between TCAM1 116, TCAM2 124, and memory array 120 are further discussed below in connection with FIGS. 3 and 4.

A processing system can be implemented using CMOS (complementary metal-oxide semiconductor) transistors as a System On Chip (SOC) or other integrated circuit device which includes at least one processor (or computing device) coupled to memory device 100 via an appropriate interface (not shown), such as a bus or the like with multiple signals or bits. The integrated circuit device may include other circuits, modules or devices, such as other memory devices (not shown), other functional modules (not shown), and external interfaces, such as input, output or input/output (I/O) ports or pins or the like (not shown). In one alternate embodiment, memory device 100 is implemented alone in an integrated circuit without any other devices. In another alternative embodiment, memory device 100 is part of a larger system on the integrated circuit. Additionally, memory cells of memory array 120 can be implemented with similar components, as further discussed below in connection with FIG. 5. Also, memory cells of TCAM1 116 and TCAM2 124 can be implemented with similar components, as further discussed below in connection with FIGS. 6 and 7.

Figure 2:
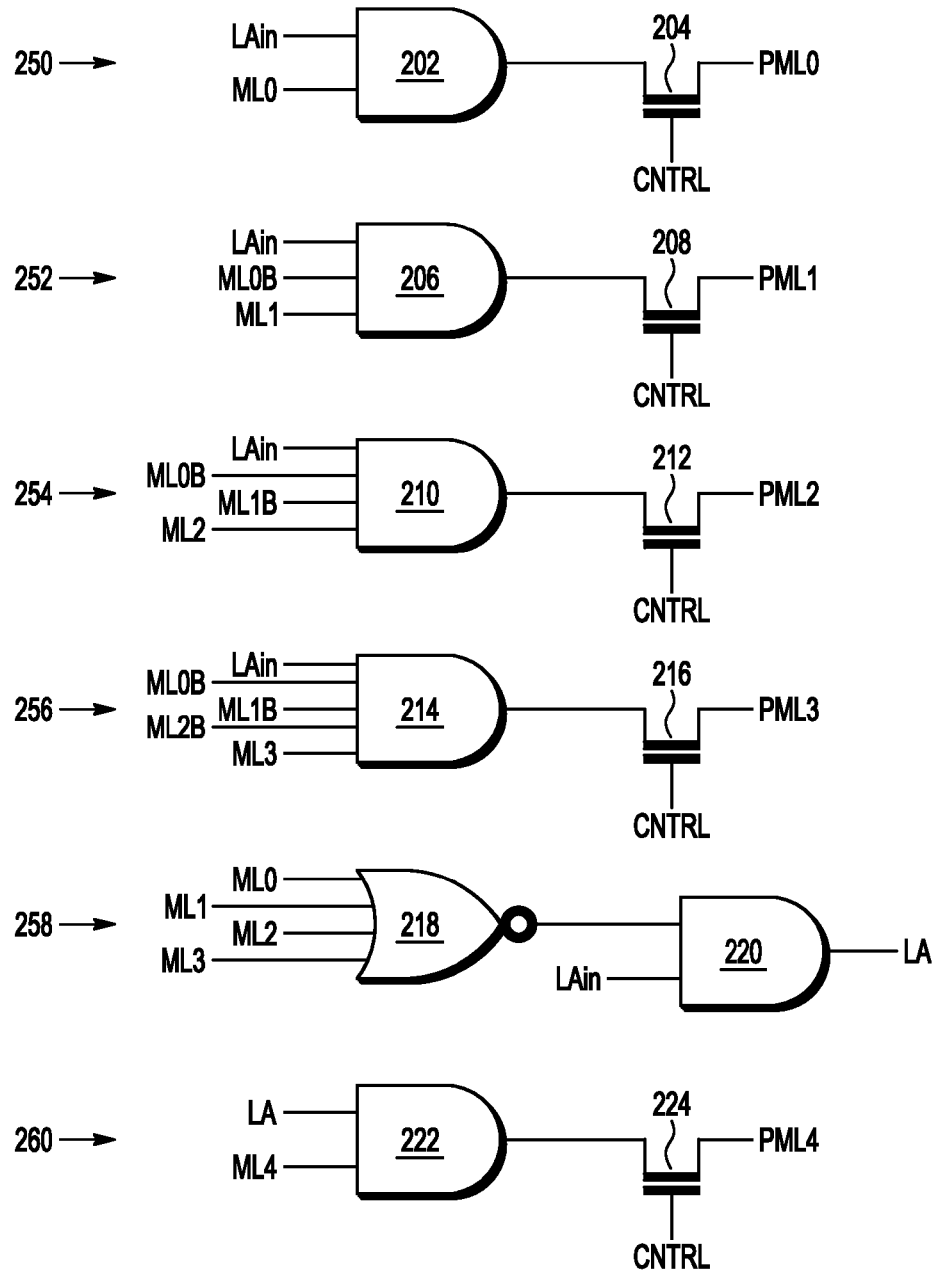
FIG. 2 illustrates block diagrams of example priority logic circuitry utilized in a memory device in which the disclosure is implemented, according to some embodiments.

FIG. 2 illustrates block diagrams of a portion of example priority logic circuitry used in priority logic 118 and 122, which includes circuits 250, 252, 254, 256, 258, and 260. Circuitry of priority logic 118 and 122 is configured to activate a priority match line that corresponds to a TCAM match line that has highest priority. In the embodiment shown, the N match lines of a TCAM (such as TCAM1 116 or TCAM2 124) are grouped into successive sets of 4 consecutive match lines. A set of circuits that includes circuits 250, 252, 254, 256, and 258 is repeated for every set of match lines, resulting in N/4 successive sets of circuits (such as N/4 sets in priority logic 118 and N/4 sets in priority logic 122). Other embodiments of priority logic circuitry can be used for differing numbers of grouped match lines. The sets of successive circuits are "chained," where an output of circuit 258 of a present set of circuits is provided to a next set of circuits, as discussed below. Circuit 260 is provided as an example of a next instance of circuit 250 in a next set of circuits. The sets of successive circuits in priority logic 118 and 122 are also coupled to control circuitry 102, which enables circuitry of priority logic 118 and 122 during search operations, and disables circuitry of priority logic 118 and 122 during other memory operations (e.g., read and write operations), as further discussed below.

A present set of circuits is shown in FIG. 2, which is coupled to an associated set of 4 match lines from TCAM. Circuits 250, 252, 254 and 256 each receive a respective true match line of the set of 4 match lines and an input look ahead signal LAin. In an initial set of circuits, LAin is an initial look ahead signal that is set by control circuitry 102 to a logic level one state during a search operation in order to enable priority logic 118 (e.g., enable the initial set of circuits of priority logic 118), and set to a logic level zero state during other memory operations in order to disable priority logic 118 (and disables priority logic 122, as discussed below). Circuits 250, 252, 254, and 256 implement a predefined priority scheme utilizing complementary versions of the set of 4 match lines (as indicated by the letter B, which may be achieved by implementing inverter elements in priority logic circuitry), where each circuit is configured to output a respective priority match line based on the priority scheme. Each priority match line (e.g., PML0-PML3) of circuits 250-256 is coupled to a corresponding word line of memory array 120, where an activated priority match line drives the corresponding word line of memory array 120 (e.g., activates the corresponding word line with VDD).

If none of the set of 4 match lines are activated (indicating that a match has not been found), circuit 258 outputs a next look ahead signal LA (e.g., a logic level one state) that enables the next set of circuits. If at least one of the set of 4 match lines are activated (indicating that a match has been found), circuit 258 outputs LA (e.g., a logic level zero state) that disables the next set of circuits in priority logic 118. Once a logic level zero state is output on an LA signal by a circuit, that logic level zero state is propagated through the remaining successive circuits (based on the logic implemented by the circuits), which disables the remaining successive circuits. A last look ahead signal is output by circuit 258 in the [N/4]th or last set of circuits in priority logic 118, which is provided as the look ahead signal 138 to priority logic 122. Look ahead signal 138 is used as the initial look ahead signal LAin for priority logic 122. In this manner, a logic level zero state received at LAin on the initial set of circuits in priority logic 118 disables priority logic 118, is then propagated on look ahead signal 138, and then disables priority logic 122.

During a search operation, look ahead signal 138 has an initial state of logic level zero state, which disables priority logic 122 while priority logic 118 determines whether a match is found in TCAM1 116. If none of the match lines of TCAM1 116 are activated (indicating that no match has been found in TCAM1 116), priority logic 118 (e.g., the last set of circuits of priority logic 118) outputs a logic level one state on look ahead signal 138, which enables the circuitry of priority logic 122. If at least one match line of TCAM1 116 is activated (indicating that a match has been found in TCAM1 116), priority logic 118 outputs a logic level zero state on look ahead signal 138, which continues to disable the circuitry of priority logic 122.

Circuit 250 of a present set of circuits includes a logic gate 202 that has an input coupled to input look ahead signal LAin. If the present set of circuits is the initial set of circuits, LAin is the initial look ahead signal set by priority logic 118. If the present set of circuits is a subsequent set of circuits, LAin is the look ahead signal provided by a previous set of circuits. Logic gate 202 also has an input coupled to match line ML0, which is a first match line of a set of 4 match lines associated with the present set of circuits. An output of logic gate 202 is coupled to priority match line PML0 via transistor 204. Transistor 204 receives a control signal CNTRL from control circuitry 102. CNTRL controls transistor 204 (and transistors 208, 212, 216, 224) to be conducting during a search operation and enables the output of circuit 250 (and output of circuits 252, 254, 256, and 260) to be provided to coupled word lines of memory array 120. CNTRL also controls transistor 204 (and transistors 208, 212, 216, 224) to be non-conducting during other memory operations (e.g., during a read or write operation).

Circuit 252 includes a logic gate 206 that has inputs coupled to LAin, ML0B (which is the complementary version of the first match line ML0), and next match line ML1. An output of logic gate 206 is coupled to priority match line PML1 via transistor 208, which receives control signal CNTRL.

Circuit 254 includes a logic gate 210 that has inputs coupled to LAin, to ML0B and ML1B (which are the complementary versions of the previous match lines ML0 and ML1), and to match line ML2. An output of logic gate 210 is coupled to priority match line PML2 via transistor 212, which receives control signal CNTRL.

Circuit 256 includes a logic gate 214 that has inputs coupled to LAin, to ML0B, ML1B, and ML2B (which are the complementary version of the previous match lines ML0, ML1, and ML2), and to next match line ML3. An output of logic gate 214 is coupled to priority match line PML3 via transistor 216, which receives control signal CNTRL.

Circuit 258 includes a logic gate 218 that has inputs coupled to ML0, ML1, ML2, and ML3. An output of logic gate 218 is coupled to an input of logic gate 220, which has another input coupled to LAin. An output of logic gate 220 produces a next look ahead signal LA, which is provided to a next set of circuits. For example, circuit 260 is a next instance of circuit 250, where circuit 260 is included in a next set of circuits (or a set of circuits that is subsequent to the present set of circuits 250-258).

In some embodiments, logic gates 202-214, 220, and 222 are each an AND gate. In some embodiments, logic gate 218 is a NOR gate. In some embodiments, transistors 204-216 and 224 are suitable switching elements that receive a control signal. It is noted that complementary versions of the logic gates and the input signals to those logic gates, as well as complementary versions of the transistors 204-216 and 224 and the control signal to those transistors, may be implemented to achieve a similar result as the circuitry illustrated in FIG. 2.

Figure 3:
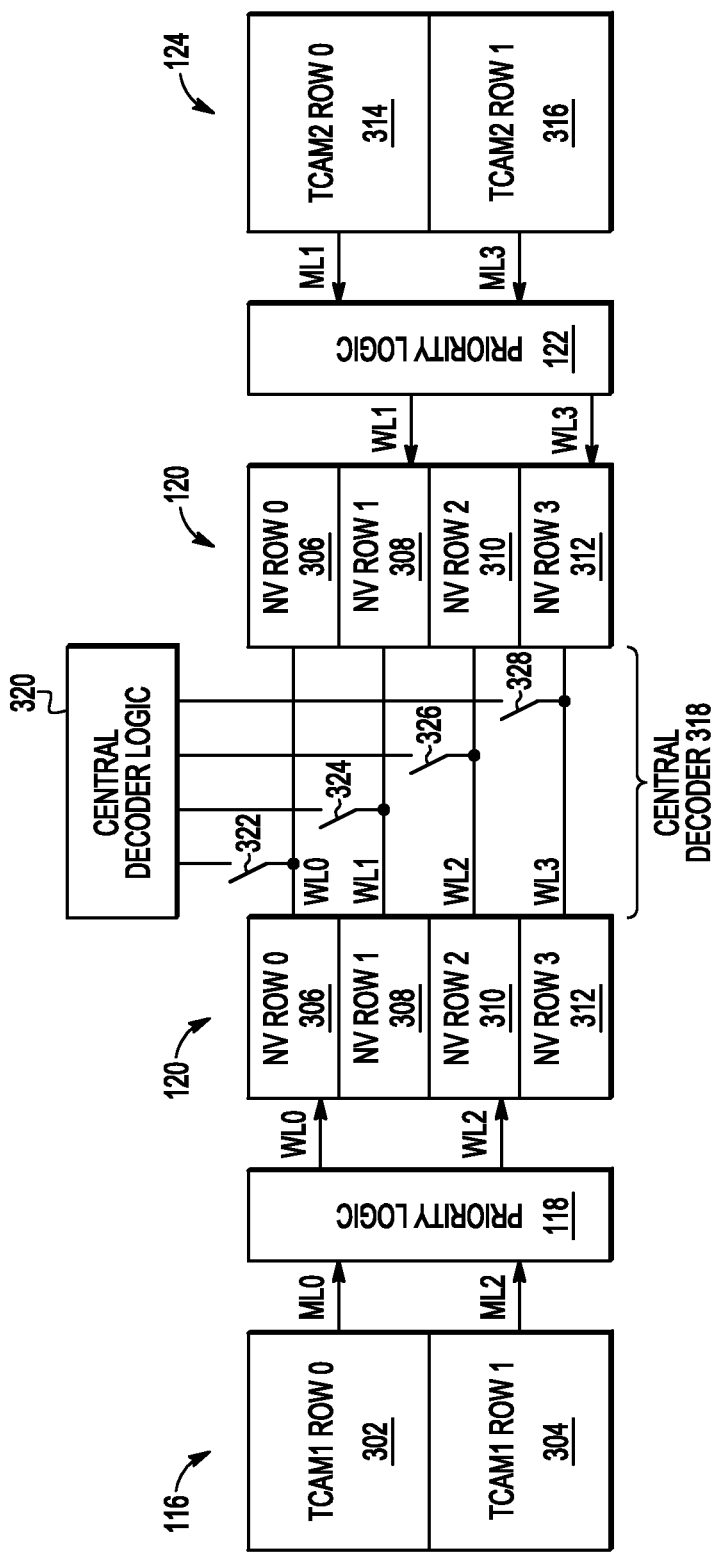
FIGS. 3 and 4 illustrate block diagrams depicting example relationships between a memory array and associated TCAMs in which the disclosure is implemented, according to some embodiments.

FIG. 3 illustrates a block diagram depicting example relationships between memory array 120 and associated TCAM1 116 and TCAM2 124. To simplify explanation, four example rows of TCAM1 116, TCAM2 124, and memory array 120 are illustrated, although TCAM1 116, TCAM2 124, and memory array 120 may include more than four rows. Each row of TCAM1 116 and TCAM2 124 is associated with a respective match line. The match lines of TCAM1 116 are coupled to priority logic 118. A first set of word lines are coupled between priority logic 118 and a first set of rows in memory array 120, where each of the word lines correspond to the match lines of TCAM1 116. Similarly, a second set of word lines are coupled between priority logic 122 and a second set of rows in memory array 120, where each of the word lines correspond to the match lines of TCAM2 124. Priority logic 118 and 122 are configured to implement a match line priority scheme. An example match line priority scheme is discussed below in connection with FIG. 4.

In the embodiment shown, priority logic 118 and 122 are coupled to rows of memory array 120 in an alternating manner, although other coupling schemes may be implemented. As illustrated, row 0 306 of memory array 120 is coupled to word line WL0, which corresponds with match line ML0 coupled to TCAM1 116 row 0 302. Row 1 308 of memory array 120 is coupled to word line WL1, which corresponds with match line ML1 coupled to TCAM2 124 row 0 314. Similarly, row 2 310 of memory array 120 is coupled to word line WL2, which corresponds with match line ML2 coupled to TCAM1 116 row 1 304. Row 3 312 of memory array 120 is coupled to word line WL3, which corresponds with match line ML3 coupled to TCAM2 124 row 1 316, and so on.

A central decoder 318 is also implemented in memory array 120, where central decoder logic 320 is coupled to the word lines of memory array 120 via a plurality of switching elements 322-328. Central decoder 318 is also coupled to and controlled by control circuitry 102, which enables central decoder 318 during read and write operations (e.g., including program, erase, and verify operations) on rows of memory array 120. Central decoder logic 320 is configured to decode an address and select a word line of memory array 120 by closing the connection of a corresponding switching element. Central decoder logic 320 is also configured to drive the selected word line(s) during read and write operations on rows of memory array 120. Priority logic 118 and 122 are disabled by control circuitry 102 during such read and write operations. During a search operation, control circuitry 102 disables central decoder 318 and enables priority logic 118, where rows of memory array 120 are instead driven by priority logic 118 and 122 during the search operation.

Figure 4:
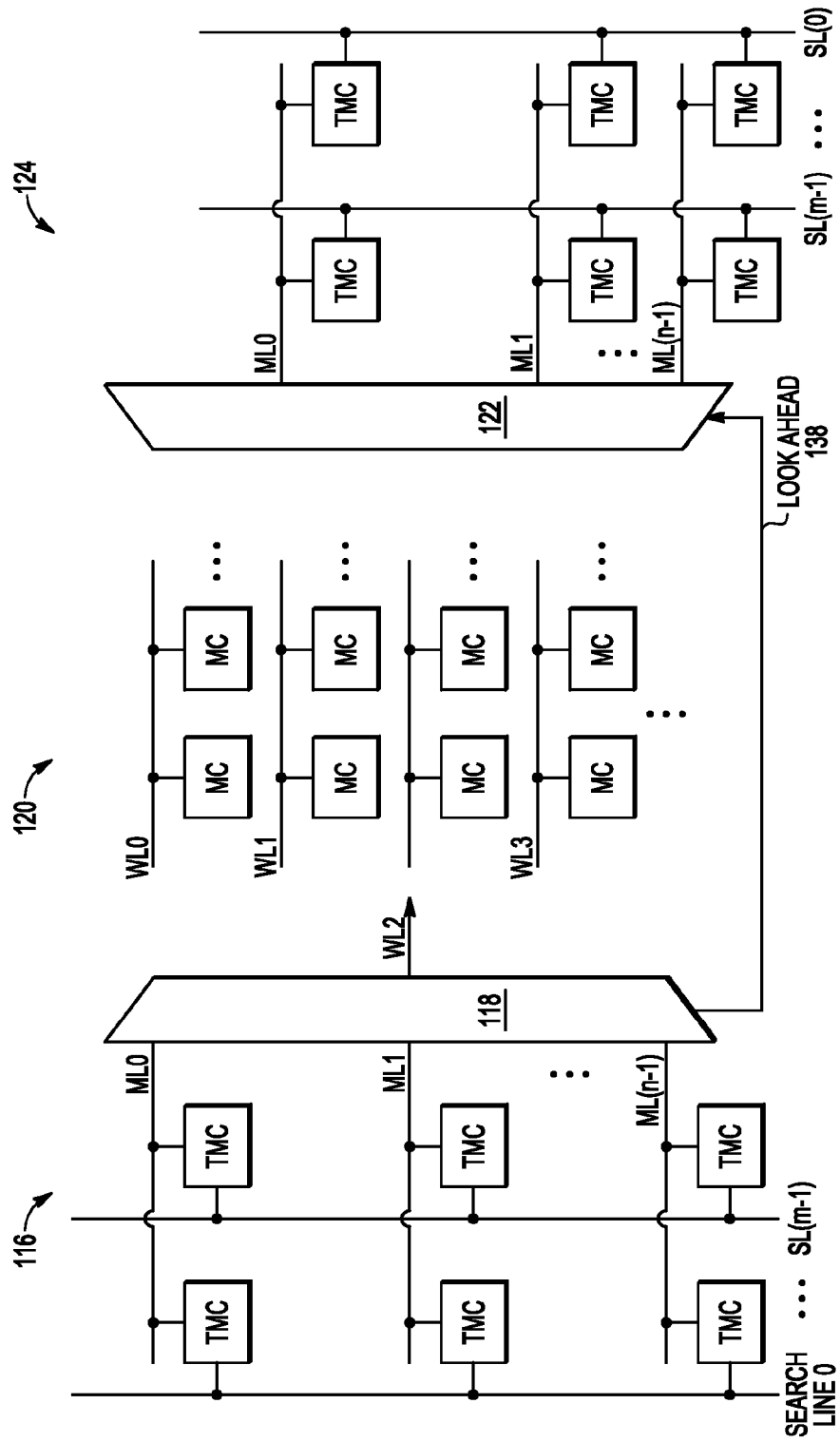

FIG. 4 illustrates a block diagram depicting example relationships between memory array 120 and associated TCAM1 116 and TCAM2 124. TCAM1 116 and TCAM2 124 each include a plurality of TCAM memory cells (TMCs), where each row of TMCs is associated with a respective one of match lines ML0-ML(n−1), and each column of TMCs is associated with a respective one of search lines SL0-SL(m−1). Memory array 120 includes a plurality of memory cells (MCs), where each row of MCs is associated with a respective one of word lines WL0-WL(2n−1). In the embodiment shown, TCAM1 116 and TCAM2 124 are coupled to alternating word lines of memory array 120, where the match line pitch of TCAM1 116 and TCAM2 124 is matched (or corresponds) to the word line pitch of memory array 120. For example, the match line pitch of TCAM1 116 and of TCAM2 124 is shown to be approximately twice the word line pitch of the memory array. In the embodiment discussed below, match lines coupled to priority logic 118 have higher priority than match lines coupled to priority logic 122.

During a search operation, priority logic 118 is enabled to determine whether a match is found in TCAM1 116, while priority logic 122 is initially disabled. Search data is provided to search lines SL0-SL(m−1) of both TCAM1 116 and TCAM2 124. Priority logic 118 is configured to wait for a predetermined amount of time in order for a match to be determined in TCAM1 116 (e.g., waits long enough for any match lines associated with rows that do not match the search data to be pulled down to a logic level zero state, while match lines associated with rows that match the search data remain at a logic level one state). In the embodiment shown, match line ML0 of TCAM1 116 has the highest priority than other matches found in TCAM1 116 (e.g., an address priority scheme is implemented, where match line ML0 is closest to the top of TCAM1 116 and has higher priority than any activated match lines located below ML0) or in TCAM2 124. Similarly, match line ML0 of TCAM2 124 has higher priority than other matches found in TCAM2 124 (e.g., higher than any activated match lines located below ML0). In one example, in response to match line ML1 of TCAM1 116 being activated, priority logic 118 activates a corresponding priority match line, which in turn is coupled to and activates a corresponding word line, such as WL2, in order for data to be read from a corresponding row in memory array 120.

If none of the match lines coupled to TCAM1 116 are activated (e.g., all match lines are pulled down to a logic level zero state), priority logic 118 outputs a look ahead signal 138 that activates priority logic 122. For example, even if priority logic 122 receives an activated match line from TCAM2 124, priority logic 122 does not output a corresponding activated word line while priority logic 122 is disabled. Once priority logic 122 is enabled by priority logic 118, priority logic 122 activates a word line corresponding to the activated match line having highest priority in TCAM2 124, in order for data to be read from a corresponding row in memory array 120. If no match line is activated during the search operation (e.g., misses in both TCAM1 116 and TCAM2 124), priority logic 122 is configured to activate a match line associated with a default row address (e.g., a least priority match line is activated).

FIG. 5 illustrates block diagrams of example memory cell structures utilized in memory array 120. An example volatile memory cell structure 500 (which can be utilized in a volatile SRAM) is illustrated on the left and an example non-volatile memory cell structure 520 (which can be utilized in a non-volatile RAM) is illustrated on the right.

Volatile memory cell 500 includes a pair of cross-coupled inverters 506 and 508, with the output of inverter 508 coupled to the input of inverter 506 via a storage node A, and the output of inverter 506 coupled to the input of inverter 508 via a storage node B. Each inverter outputs a state, which is either a logic level one state or a logic level zero state, onto a respective one of storage nodes A and B. The state that is output by inverter 508 onto storage node A is opposite the state that is output by inverter 506 onto storage node B, where the cross-coupled nature of inverters 506 and 508 reinforces each other's state and retains such state respectively at storage nodes A and B. The state retained at storage nodes A and B (where storage node A retains a true state and storage node B retains a complementary state) represents or encodes a data value, or a bit, that is stored by the volatile memory cell 500 while power is provided to memory array 120.

Volatile memory cell 500 also includes transistors 502 and 504, also referred to as access transistors. Transistors 502 and 504 allow access to read or write the data value (or the state) on storage nodes A and B, which in turn controls the state output by inverters 506 and 508. Transistor 502 has a first current electrode coupled to true bit line BL, a second current electrode coupled to storage node A, and a control electrode coupled to word line WL. Transistor 504 has a first current electrode coupled to storage node B, a second current electrode coupled to complementary bit line BLB, and a control electrode coupled to word line WL.

Non-volatile memory cell 520 includes a programmable resistive element 510 (also referred to as R510) and a transistor 512 (also referred to as an access transistor). R510 is written to a non-volatile state (e.g., LRS or HRS), which represents either a logic level one state or a logic level zero state. The non-volatile state encodes a data value, or a bit, that is stored by the non-volatile memory cell 520, even when power is not provided to memory array 120. R510 has a terminal coupled to bit line BL and another terminal coupled to a first current terminal of transistor 512. Transistor 512 also has a second current terminal coupled to a source line, and a control electrode coupled to word line WL.

FIG. 6 illustrates a block diagram of an example volatile memory cell structure utilized in an associated TCAM of the present disclosure. It is noted that a volatile TCAM memory cell includes two neighboring volatile memory cells 632 and 634, where each memory cell 632 and 634 store a bit, and where the two bits together encode a data state of the volatile TCAM memory cell. The volatile memory cell 632 includes a pair of cross-coupled inverters 604 and 606, with the output of inverter 606 coupled to the input of inverter 604 via a storage node A, and the output of inverter 604 coupled to the input of inverter 606 via a storage node B. Each inverter outputs a state, which is either a logic level one state or a logic level zero state, onto a respective one of storage nodes A and B. The state that is output by inverter 606 onto storage node A is opposite the state that is output by inverter 604 onto storage node B, where the cross-coupled nature of inverters 604 and 606 reinforces each other's state and retains such state respectively at storage nodes A and B. The state retained at storage nodes A and B (where storage node A retains a true state and storage node B retains a complementary state) represents or encodes a data value, or a bit, that is stored by cell 632 while power is provided to the TCAM. The volatile memory cell 634 includes cross-coupled inverters 612 and 614 in a similar structure.

Volatile memory cell 632 also includes transistors 602 and 608, also referred to as access transistors. Transistors 602 and 608 allow access to read or write the data value (or the state) on storage nodes A and B, which in turn controls the state output by inverters 604 and 606. Transistor 602 has a first current electrode coupled to true bit line BL0, a second current electrode coupled to storage node A, and a control electrode coupled to word line WL1. Transistor 608 has a first current electrode coupled to storage node B, a second current electrode coupled to complementary bit line BLB0, and a control electrode coupled to word line WL1. Volatile memory cell 634 includes transistors 610 and 616 in a similar structure coupled to true bit line BL1 and complementary bit line BLB1.

Volatile memory cell 632 also includes transistors 618 and 620. Transistor 618 has a control electrode coupled to storage node A, a first current electrode coupled to match line ML, and a second current electrode coupled to a first current electrode of transistor 620. Transistor 620 also has a second current electrode coupled to ground, and a control electrode coupled to complementary search line SLB. Volatile memory cell 634 includes transistors 622 and 624 in a similar structure, with the control electrode of transistor 622 coupled to storage node B (which stores a complementary state) and the control electrode of transistor 624 coupled to true search line SL.

During a search operation, input search data (or voltages that represent the input search data) is provided to search lines SL and SLB. If the true data stored at storage node A of cell 632 matches the complementary search data on SLB (which is equivalent to the true data stored at storage node A of cell 632 not matching the true search data on SL), transistors 618 and 620 are conductive and pull down match line ML to indicate a miss. Similarly, if the complementary data stored at storage node B of cell 634 matches true search data on SL (which is equivalent to the true data stored at storage node A of cell 634 not matching the true search data on SL), transistors 622 and 624 are conductive and pull down the match line ML to indicate a miss.

FIG. 7 illustrates a block diagram of an example non-volatile memory cell structure utilized in an associated TCAM of the present disclosure. The non-volatile TCAM cell includes three programmable resistive elements 630, 634, and 638 (also referred to as R630, R634, and R638) and three transistors 632, 636, and 640 (also referred to as access transistors).

R630 and R634 are each written to a non-volatile resistive state (e.g., LRS or HRS), where the resistive states of R630 and R634 together encode one of three data states, including a logic level zero state, a logic level one state, and a don't care state. R630 and R634 both have a terminal coupled to match line ML. R630 has another terminal coupled to a first current electrode of transistor 632, which in turn has a second current electrode coupled to ground and a control electrode coupled to true search line SL. R634 has another terminal coupled to a first current electrode of transistor 636, which in turn has a second current electrode coupled to ground and a control electrode coupled to complementary search line SLB. R638 also has a terminal coupled to match line ML and another terminal coupled to a first current electrode of transistor 640. Transistor 640 also has a second current electrode coupled to ground and a control electrode coupled to source line SX.

During a search operation, input search data (or voltages that represent the input search data) is provided to search lines SL and SLB and source line SX. If the data stored in R630 and R634 of the TCAM memory cell does not match the search data, one or more of transistors 632, 636, 638 become conductive, pulling down the match line (ML) to indicate a miss.

By now it should be appreciated that there has been provided a compact memory architecture that includes TCAMs tightly coupled to a memory array. In one embodiment of the present disclosure, a memory device is provided, which includes a first ternary content addressable memory (TCAM); a second TCAM; a memory array coupled to the first and second TCAMs; a first priority logic coupled between the first TCAM and the memory array; a second priority logic coupled between the second TCAM and the memory array; and a look-ahead signal generated by the first priority logic and provided to the second priority logic, wherein match lines from the first and second TCAMs are coupled to respective word lines in the memory array.

One aspect of the above embodiment provides that the memory device further includes decode logic coupled to the memory array; and control circuitry coupled to the first and second priority logic and the decode logic.

A further aspect of the above embodiment provides that during a memory array read operation, the control circuitry disables the first and second priority logic and enables the decode logic.

Another further aspect of the above embodiment provides that during a memory array write operation, the control circuitry disables the first and second priority logic and enables the decode logic.

Another further aspect of the above embodiment provides that during a TCAM search operation, the control circuitry enables the first and second priority logic and disables the decode logic.

Another aspect of the above embodiment provides that the first and second TCAMs include volatile memory cells and the memory array includes one of a group consisting of volatile memory cells and non-volatile memory cells.

Another aspect of the above embodiment provides that the first and second TCAMs include non-volatile memory cells and the memory array includes one of a group consisting of volatile memory cells and non-volatile memory cells.

Another aspect of the above embodiment provides that when there is a match in the first TCAM, the look-ahead signal is set to disable the second priority logic, and when there is no match in the first TCAM, the look-ahead signal is set to enable the second priority logic.

Another aspect of the above embodiment provides that a pitch of match lines for the first and second TCAMs is approximately twice a pitch of word lines in the memory array.

In another aspect of the present disclosure, a semiconductor device is provided, which includes a memory device including: a first ternary content addressable memory (TCAM) array; a second TCAM array; a memory array coupled to the first and second TCAMs; and control circuitry operable to set a look-ahead signal to give the first TCAM array higher priority than the second TCAM array during search operations.

One aspect of the above embodiment provides that the device further includes a first portion of memory cells in the memory array are coupled to the first TCAM array and a second portion of memory cells in the memory array are coupled to the second TCAM array.

Another aspect of the above embodiment provides that the device further includes an address decode unit in the memory array, wherein the address decode unit is enabled during memory array read and write operations, and the address decode unit is disabled during search operations.

Another aspect of the above embodiment provides that the device further includes a first priority logic unit coupled between the first TCAM and the memory array; and a second priority logic unit coupled between the second TCAM and the memory array, wherein the first and second priority logic units are enabled during search operations and disabled during memory array read and write operations.

A further aspect of the above embodiment provides that the device further includes a set of switches in the memory array, wherein the switches are set to: couple match lines in the first and second TCAM arrays to respective word lines in the memory array through the first and second priority logic units during the search operations, and couple the word lines to the address decode unit during the read and write operations.

Another aspect of the above embodiment provides that the first and second TCAMs include volatile memory cells and the memory array includes one of a group consisting of volatile memory cells and non-volatile memory cells.

Another aspect of the above embodiment provides that the first and second TCAMs include non-volatile memory cells and the memory array includes one of a group consisting of volatile memory cells and non-volatile memory cells.

A further aspect of the above embodiment provides that when there is a match in the first TCAM, the look-ahead signal is set to disable the second priority logic, and when there is no match in the first TCAM, the look-ahead signal is set to enable the second priority logic.

In another embodiment of the present disclosure, a method of operating a memory device is provided, which includes, during a search operation, enabling a first priority logic unit coupled between a first ternary content addressable memory (TCAM) array and a memory array and enabling a second priority logic unit coupled between a second TCAM array and the memory array while the search operation is performed on the first and second TCAM arrays, and disabling an address decode unit in the memory array.

One aspect of the above embodiment provides that the method further includes, during read and write operations of the memory array, disabling the first and second priority logic units and enabling the address decode unit in the memory array.

Another aspect of the above embodiment provides that the method further includes setting a look-ahead signal to give the first TCAM array higher priority than the second TCAM array during the search operation.

The circuitry described herein may be implemented on a semiconductor substrate, which can be any semiconductor material or combinations of materials, such as gallium arsenide, silicon germanium, silicon-on-insulator (SOI), silicon, monocrystalline silicon, the like, and combinations of the above.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

As used herein the terms "substantial" and "substantially" mean sufficient to accomplish the stated purpose in a practical manner and that minor imperfections, if any, are not significant for the stated purpose.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory device comprising:
   a first ternary content addressable memory (TCAM);
   a second TCAM;
   a memory array coupled to the first and second TCAMs;
   a first priority logic coupled between the first TCAM and the memory array;
   a second priority logic coupled between the second TCAM and the memory array; and
   a look-ahead signal generated by the first priority logic and provided to the second priority logic, wherein match lines from the first and second TCAMs are coupled to respective word lines in the memory array, and
   wherein a pitch of match lines for the first and second TCAMs is approximately twice a pitch of word lines in the memory array.

2. The memory device of claim 1 further comprising:
   decode logic coupled to the memory array; and
   control circuitry coupled to the first and second priority logic and the decode logic.

3. The memory device of claim 2 wherein:
   during a memory array read operation, the control circuitry disables the first and second priority logic and enables the decode logic.

4. The memory device of claim 2 wherein:
   during a memory array write operation, the control circuitry disables the first and second priority logic and enables the decode logic.

5. The memory device of claim 2 wherein:
   during a TCAM search operation, the control circuitry enables the first and second priority logic and disables the decode logic.

6. The memory device of claim 1 wherein:
   the first and second TCAMs include volatile memory cells and the memory array includes one of a group consisting of volatile memory cells and non-volatile memory cells.

7. The memory device of claim 1 wherein:
   the first and second TCAMs include non-volatile memory cells and the memory array includes one of a group consisting of volatile memory cells and non-volatile memory cells.

8. The memory device of claim 1 wherein:
   when there is a match in the first TCAM, the look-ahead signal is set to disable the second priority logic, and when there is no match in the first TCAM, the look-ahead signal is set to enable the second priority logic.

9. The memory device of claim 7 wherein:
the non-volatile memory cells are implemented using one or more programmable resistive elements.

10. A semiconductor device comprising:
a memory device including:
  a first ternary content addressable memory (TCAM) array;
  a second TCAM array;
  a memory array coupled to the first and second TCAMs;
  an address decode unit coupled to the memory array; and
  control circuitry operable to
    set a look-ahead signal to give the first TCAM array higher priority than the second TCAM array during TCAM search operations, and
    disable the address decode unit during TCAM search operations.

11. The device of claim 10 further comprising:
a first portion of memory cells in the memory array are coupled to the first TCAM array and a second portion of memory cells in the memory array are coupled to the second TCAM array.

12. The device of claim 10 wherein the address decode unit is enabled during memory array read and write operations.

13. The device of claim 10 further comprising:
a first priority logic unit coupled between the first TCAM and the memory array; and
a second priority logic unit coupled between the second TCAM and the memory array, wherein the first and second priority logic units are enabled during TCAM search operations and disabled during memory array read and write operations.

14. The device of claim 12 further comprising:
a set of switches in the memory array, wherein the switches are set to:
  couple match lines in the first and second TCAM arrays to respective word lines in the memory array through the first and second priority logic units during the search operations, and
  couple the word lines to the address decode unit during the read and write operations.

15. The device of claim 10 wherein:
the first and second TCAMs include volatile memory cells and the memory array includes one of a group consisting of volatile memory cells and non-volatile memory cells.

16. The device of claim 10 wherein:
the first and second TCAMs include non-volatile memory cells and the memory array includes one of a group consisting of volatile memory cells and non-volatile memory cells.

17. The device of claim 13 wherein:
when there is a match in the first TCAM, the look-ahead signal is set to disable the second priority logic, and when there is no match in the first TCAM, the look-ahead signal is set to enable the second priority logic.

18. A method of operating a memory device comprising:
enabling a first priority logic unit coupled between a first ternary content addressable memory (TCAM) array and a memory array and enabling a second priority logic unit coupled between a second TCAM array and the memory array while a TCAM search operation is performed on the first and second TCAM arrays; and
disabling an address decode unit in the memory array during the TCAM search operation.

19. The method of claim 18 further comprising:
during read and write operations of the memory array, disabling the first and second priority logic units and enabling the address decode unit in the memory array.

20. The method of claim 18 further comprising:
setting a look-ahead signal to give the first TCAM array higher priority than the second TCAM array during the TCAM search operation.

* * * * *